US006721136B2

United States Patent
Kurihara et al.

(10) Patent No.: US 6,721,136 B2
(45) Date of Patent: Apr. 13, 2004

(54) PIEZOELECTRIC ACTUATOR AND INFORMATION STORAGE APPARATUS

(75) Inventors: Kazuaki Kurihara, Kawasaki (JP); Michinori Kutami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/434,255

(22) Filed: May 8, 2003

(65) Prior Publication Data
US 2003/0193755 A1 Oct. 16, 2003

Related U.S. Application Data

(62) Division of application No. 09/761,282, filed on Jan. 16, 2001, now Pat. No. 6,587,313.

(30) Foreign Application Priority Data
May 12, 2000 (JP) .................................... 2000-140306

(51) Int. Cl.[7] .................................... G11B 5/56
(52) U.S. Cl. .................... 360/294.4; 310/311
(58) Field of Search .................. 360/294.4, 294.6; 310/311, 323, 367, 369

(56) References Cited

U.S. PATENT DOCUMENTS

| 4,814,908 A | 3/1989 | Schmitz |
| 5,189,578 A | 2/1993 | Mori et al. |
| 5,440,437 A | 8/1995 | Sanada et al. |
| 5,521,778 A | 5/1996 | Boutaghou et al. |
| 5,781,381 A | 7/1998 | Koganezawa et al. |
| 6,249,402 B1 | 6/2001 | Katayama |
| 6,327,120 B1 | 12/2001 | Koganezawa et al. |
| 6,381,104 B1 | 4/2002 | Soeno et al. |
| 6,587,313 B2 * | 7/2003 | Kurihara et al. ......... 360/294.4 |

FOREIGN PATENT DOCUMENTS

| JP | 2227886 | 9/1990 |
| JP | 3-69072 | 3/1991 |
| JP | 5-502737 | 5/1993 |

* cited by examiner

Primary Examiner—Robert S. Tupper
(74) Attorney, Agent, or Firm—Greer, Burns & Crain, Ltd.

(57) ABSTRACT

There are disclosed a piezoelectric actuator which can obtain large displacement at low voltage, which is small-sized and lightweight, and whose manufacture cost is low, and a small-sized lightweight information storage apparatus in which the piezoelectric actuator is incorporated, and which is provided with a small inertia moment during head driving and a high recording density. A piezoelectric actuator 200 includes a center body 200a and two spiral arms 200b, and two arms 200b are entirely in rotation symmetry and non-linear symmetry.

2 Claims, 15 Drawing Sheets

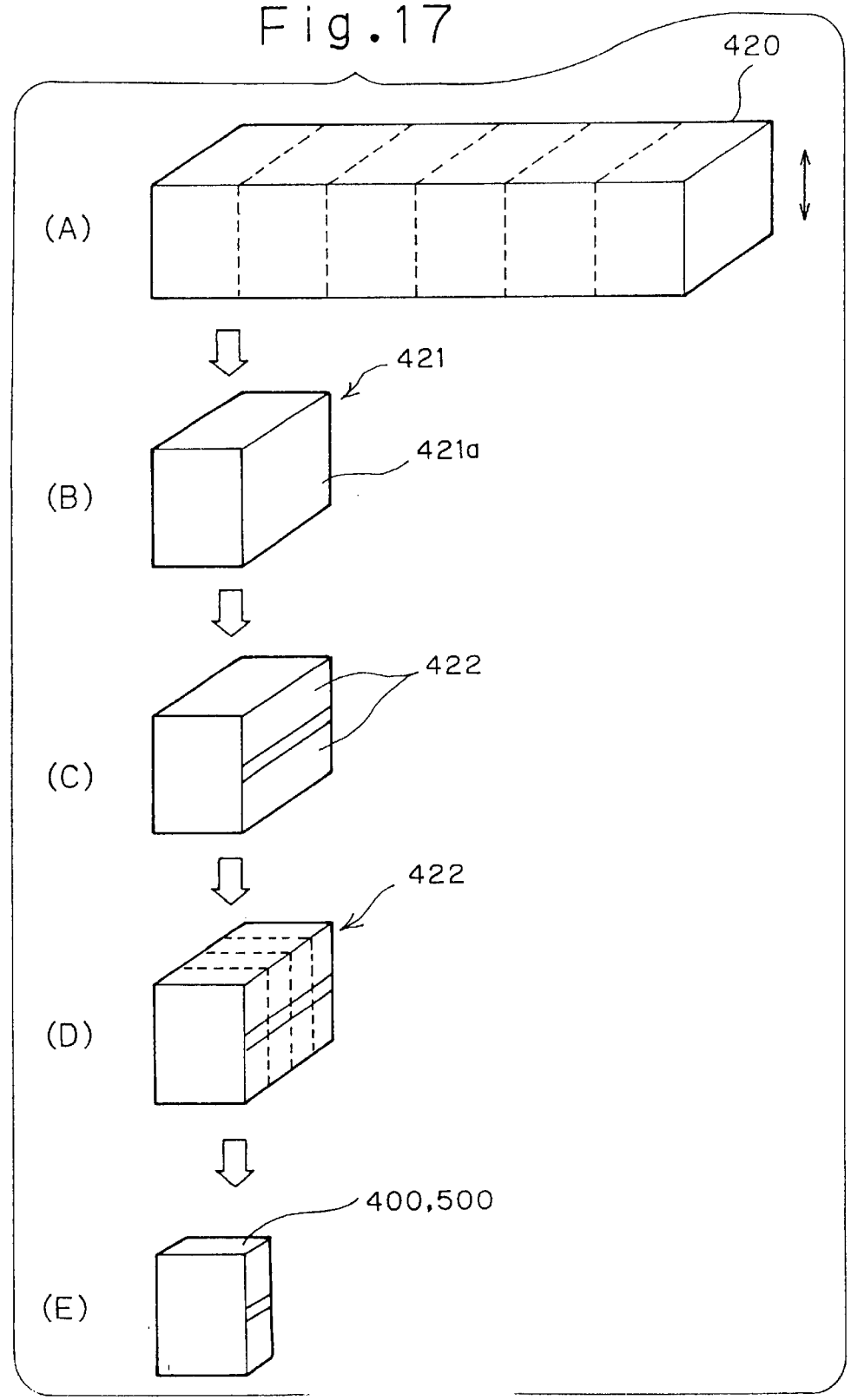

PIEZOELECTRIC ACTUATOR AND INFORMATION STORAGE APPARATUS

This is a divisional, of application Ser. No. 09/761,282, filed Jan. 16, 2001 now U.S. Pat. No. 6,587,313.

BACKGROUND OF THE INVENTION i) Field of the Invention

The present invention relates to a piezoelectric actuator, and an information storage apparatus in which the piezoelectric actuator is used.

ii) Description of Related Art

As an information storage apparatus built in or connected to electronic apparatuses such as a personal computer and a word processor, a hard disk drive has been heretofore known. The hard disk drive is generally provided with a disk as an information storage medium, and a head for reading/writing a recording bit with respect to the disk, and is also provided with an arm for holding the head in the vicinity of the disk, and an electromagnetic actuator for driving the arm to move the head along the disk.

A recording density of the hard disk drive has increased with development of the personal computer or the like, and particularly in recent years, has rapidly increased with an increasing demand for handling of image or music with the personal computer or the like. Moreover, with enhancement of the recording density of the hard disk drive, recording bit on the disk has been finely divided, disk rotation speed has increased, and high precision and high rate in positioning the head have been requested. Furthermore, miniaturization, lightening and power saving of the hard disk drive have also been promoted.

Therefore, in order to position the head at high precision and high rate, a hard disk drive has been proposed in which a piezoelectric actuator independent of the conventional electromagnetic actuator is disposed midway on the arm.

However, the heretofore proposed piezoelectric actuator and hard disk drive have problems that sufficient displacement cannot be obtained, drive voltage is high, dimension and weight are large, inertia moment during head driving is large, and manufacture cost is high.

These problems are not generated only in the hard disk drive, and are generally generated with respect to the information storage apparatus in which the head is held and moved by the arm.

SUMMARY OF THE INVENTION

The present invention has been developed in consideration of the aforementioned situations, and an object thereof is to provide a piezoelectric actuator in which large displacement is obtained at low voltage, which is small-sized and lightweight, and whose manufacture cost is low, and an information storage apparatus in which the piezoelectric actuator is incorporated, whose inertia moment during head driving is small, and which is high in recording density, small-sized and lightweight.

In order to achieve the aforementioned object, according to the present invention, there is provided a first piezoelectric actuator comprising:

a piezoelectric layer which is formed of a piezoelectric material of a two-dimensional shape provided with a central portion, and a group of arm portions extended to the outside from the central portion in rotation symmetry and nonlinear symmetry, and which is compressed/extended in an in-layer direction; and a plurality of electrode layers for holding the piezoelectric layer.

Here, the piezoelectric layer may be a flat layer having the two-dimensional shape, or a layer curved in the two-dimensional shape.

When a voltage is applied to the piezoelectric layer, the piezoelectric layer is contracted in the in-layer direction. In this case, if tip ends of respective arm portions constituting the arm portion group are fixed to a common rigid body, because of the two-dimensional shape, the central portion largely rotates at a low voltage. Moreover, since the structure of the first piezoelectric actuator of the present invention is easily manufactured, the first piezoelectric actuator can inexpensively be manufactured as a small-sized lightweight actuator.

In the first piezoelectric actuator of the present invention, the arm portion constituting the arm portion group is preferably turned to a backside via the central portion with respect to a root by which the arm portion is connected to the central portion.

Moreover, the first piezoelectric actuator of the present invention is preferably provided with a plurality of the piezoelectric layers.

For the piezoelectric actuator including the arm portion turned to the backside of the central portion, rotation amount of the central portion is large for contraction amount of the arm portion. For the piezoelectric actuator provided with a plurality of piezoelectric layers, the contraction amount of the piezoelectric layer is large for the voltage applied between the electrode layers. Therefore, by these piezoelectric actuators, larger displacement can be obtained at a lower voltage.

When the first piezoelectric actuator of the present invention is provided with a plurality of piezoelectric layers, the plurality of the electrode layers of the same potential are preferably connected to one another by a via hole.

The piezoelectric actuator employing the via hole as means for connecting the electrode layers to one another is easy in manufacture and low in manufacture cost.

Moreover, in the first piezoelectric actuator of the present invention, the piezoelectric layer is formed preferably of lead zirconate titanate (PZT) based piezoelectric ceramic, more preferably of PNN-PT-PZ based piezoelectric ceramic.

As the piezoelectric material for forming the piezoelectric layer, PZT, PT, barium titanate, layered perovskite and other piezoelectric materials can be utilized, but PZT based piezoelectric ceramic is inexpensive, large in piezoelectric constant, and suitable as the piezoelectric material for forming the piezoelectric layer. Particularly, a PNN-PT-PZ based piezoelectric material indicates a particularly high piezoelectric constant among the PZT based piezoelectric materials, is superior in sinterability and is therefore particularly preferable as the piezoelectric material to form the piezoelectric layer.

To achieve the aforementioned object, according to the present invention, there is provided a second piezoelectric actuator comprising:

a driving portion provided with a lamination structure including at least one piezoelectric layer of a piezoelectric material and a plurality of electrode layers for holding the piezoelectric layer, and compressed/extended in a lamination direction of the lamination structure; and a holding portion for holding a plurality of the driving portions in an arrangement of rotation symmetry and nonlinear symmetry including the lamination direction in a predetermined common plane.

For the second piezoelectric actuator of the present invention, when the plurality of driving portions held by the holding portion are all compressed/extended, the aforementioned arrangement causes large rotation displacement at a low voltage. Moreover, since the structure of the second piezoelectric actuator of the present invention is easily manufactured, the second piezoelectric actuator can inexpensively be manufactured as the small-sized lightweight actuator.

The second piezoelectric actuator of the present invention is typically provided with two driving portions, and the typical second piezoelectric actuator is provided with an immobile portion adjacent to the driving portion in a direction intersecting the direction in which the driving portion is compressed/extended, Wherein the holding portion holds two pairs of the driving portion and the immobile portion opposite to each other in such a manner that the driving portion of one pair turns the compressed/extended direction of the driving portion to the immobile portion of the other pair.

Moreover, for the typical second piezoelectric actuator of the present invention, the holding portion preferably holds two pairs of the driving portion and the immobile portion in such a manner that the driving portion is disposed opposite to the immobile portion via a slit.

According to the piezoelectric actuator in which the driving portion is disposed opposite to the immobile portion via the slit in this manner, the driving portion is easily compressed/extended, and larger displacement can be obtained at a lower voltage.

To achieve the aforementioned object, according to the present invention, there is provided a first information storage apparatus comprising:

a head portion on which a head for performing at least one of information recording and information reproduction with respect to a predetermined information storage medium is mounted;

an arm portion for holding the head portion in such a manner that the head mounted on the head portion is disposed in the vicinity of or in contact with the information storage medium;

an arm portion actuator for driving the arm portion to move the head mounted on the head portion held by the arm portion along the information storage medium; and a head portion actuator for rotating the head portion with respect to the arm portion and centering on a gravity center of the head portion, Wherein the head portion actuator comprises:

a piezoelectric layer which is formed of a piezoelectric material of a two-dimensional shape provided with a central portion, and a group of arm portions extended to the outside from the central portion in rotation symmetry and nonlinear symmetry, and which is compressed/extended in an in-layer direction; and a plurality of electrode layers for holding the piezoelectric layer.

Here, the head may be a magnetic head or an optical head.

For the first information storage apparatus of the present invention, the head portion includes the head, and a slider, with the head mounted thereon, for sliding on the information storage medium, the arm portion includes the arm driven by the arm portion actuator and a suspension connected to the arm, and the head portion actuator may be disposed between the suspension and the slider.

Alternatively, for the first information storage apparatus of the present invention, the head portion includes the head, the slider, with the head mounted thereon, for sliding on the information storage medium, and a suspension for holding the slider, and the head portion actuator may be disposed between the suspension and the arm portion.

According to the first information storage apparatus of the present invention, since the head portion is rotated centering on the gravity center by the head portion actuator, the inertia moment during head driving is small, and head position can highly precisely be controlled. Moreover, the head portion actuator is a small-sized lightweight actuator similar to the first piezoelectric actuator. Therefore, the first information storage apparatus of the present invention is realized as a small-sized lightweight apparatus with a high recording density.

Moreover, for the first information storage apparatus of the present invention, the head portion actuator is preferably joined to the arm portion by a portion corresponding to the tip end, of the arm portion constituting the arm portion group, extending from the central portion, and joined to the head portion by a portion corresponding to the central portion. Furthermore, in the preferably constituted information storage apparatus, the electrode layer is preferable in that voltage is applied to the head portion actuator in its portion connected to the arm portion. The preferably constituted information storage apparatus is easily manufactured.

To achieve the aforementioned object, according to the present invention, there is provided a second information storage apparatus comprising:

a head portion on which a head for performing at least one of information recording and information reproduction with respect to a predetermined information storage medium is mounted;

an arm portion for holding the head portion in such a manner that the head mounted on the head portion is disposed in the vicinity of or in contact with the information storage medium;

an arm portion actuator for driving the arm portion to move the head mounted on the head portion held by the arm portion along the information storage medium; and a head portion actuator for rotating the head portion with respect to the arm portion and centering on a gravity center of the head portion, Wherein the head portion actuator comprises:

a driving portion provided with a lamination structure including at least one piezoelectric layer of a piezoelectric material and a plurality of electrode layers for holding the piezoelectric layer, and compressed/extended in a lamination direction of the lamination structure; and a holding portion for holding a plurality of the driving portions in an arrangement of rotation symmetry and nonlinear symmetry including the lamination direction in a predetermined common plane.

Additionally, for the head portion actuator referred to in the information storage apparatus of the present invention, only a basic mode is described herein, but this simply avoids redundancy, and the head portion actuator referred to in the information storage apparatus of the present invention includes not only the basic mode of the head portion actuator but also various modes of head portion actuators applied to the aforementioned respective modes of the piezoelectric actuator.

Moreover, also for the second information storage apparatus of the present invention, to avoid redundant description, only the basic mode is described, but the second information storage apparatus of the present invention includes various modes of the second information storage apparatus applied to the respective modes of the first information storage apparatus.

BRIEF DESCRIPTION OF THE DRAWINGS

FIG. 17 is a diagram showing a process of processing a calcined material into the piezoelectric actuator.

DETAILED DESCRIPTION OF THE PREFERRED EMBODIMENTS

Embodiments of the present invention will be described hereinafter.

Figure 1:
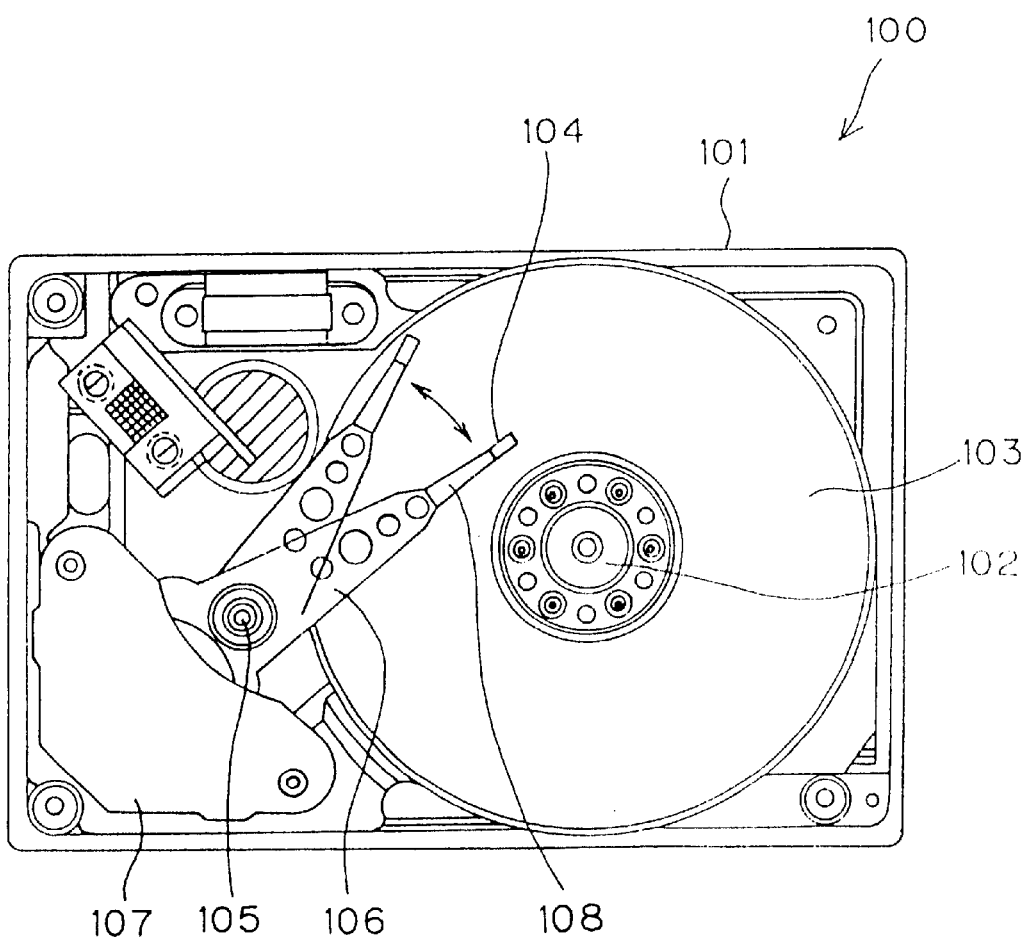
FIG. 1 is a diagram showing a first embodiment of an information recording apparatus according to the present invention.

FIG. 1 is a diagram showing a first embodiment of an information recording apparatus according to the present invention.

A hard disk drive (HDD) 100 shown in FIG. 1 shows the first embodiment of the information recording apparatus of the present invention, and the first embodiment of a piezoelectric actuator of the present invention is incorporated. A housing 101 of the hard disk drive 100 contains: a magnetic disk 103 attached to a rotation shaft 102 to rotate; a slider 104 on which a magnetic head for performing information recording and information reproduction with respect to the magnetic disk 103 is mounted; a suspension 108 for holding the slider 104 via the piezoelectric actuator described later; a carriage arm 106 to which the suspension 108 is fixed and which moves centering on an arm shaft 105 and along the surface of the magnetic disk 103; and an arm actuator 107 for driving the carriage arm 106. In the hard disk drive 100 shown in FIG. 1, the magnetic head and slider 104 constitute the head portion referred to in the present invention, and the suspension 108 and carriage arm 106 constitute the arm portion referred to in the present invention. Therefore, the arm actuator 107 corresponds to an arm portion actuator referred to in the present invention.

During recording of information into the magnetic disk and reproduction of the information stored in the magnetic disk 103, the arm actuator 107 constituted by a magnetic circuit drives the carriage arm 106, the piezoelectric actuator described later drives the slider 104, and the magnetic head is positioned in a desired track on the rotating magnetic disk 103. With rotation of the magnetic disk 103, the magnetic head mounted on the slider 104 successively approaches respective micro areas arranged in respective tracks of the magnetic disk 103. During information recording, an electric recording signal is inputted to the magnetic head having approached the magnetic disk 103 in this manner, the magnetic head applies a magnetic field to the respective micro areas in response to the recording signal, and the information carried by the recording signal is recorded as a magnetization direction of the respective micro areas. Moreover, during information reproduction, the magnetic head extracts the information recorded as the magnetization direction of the respective micro areas as an electric reproduction signal for the magnetic field in which magnetization is generated. An inner space of the housing 101 is closed by a cover (not shown).

Figure 2:
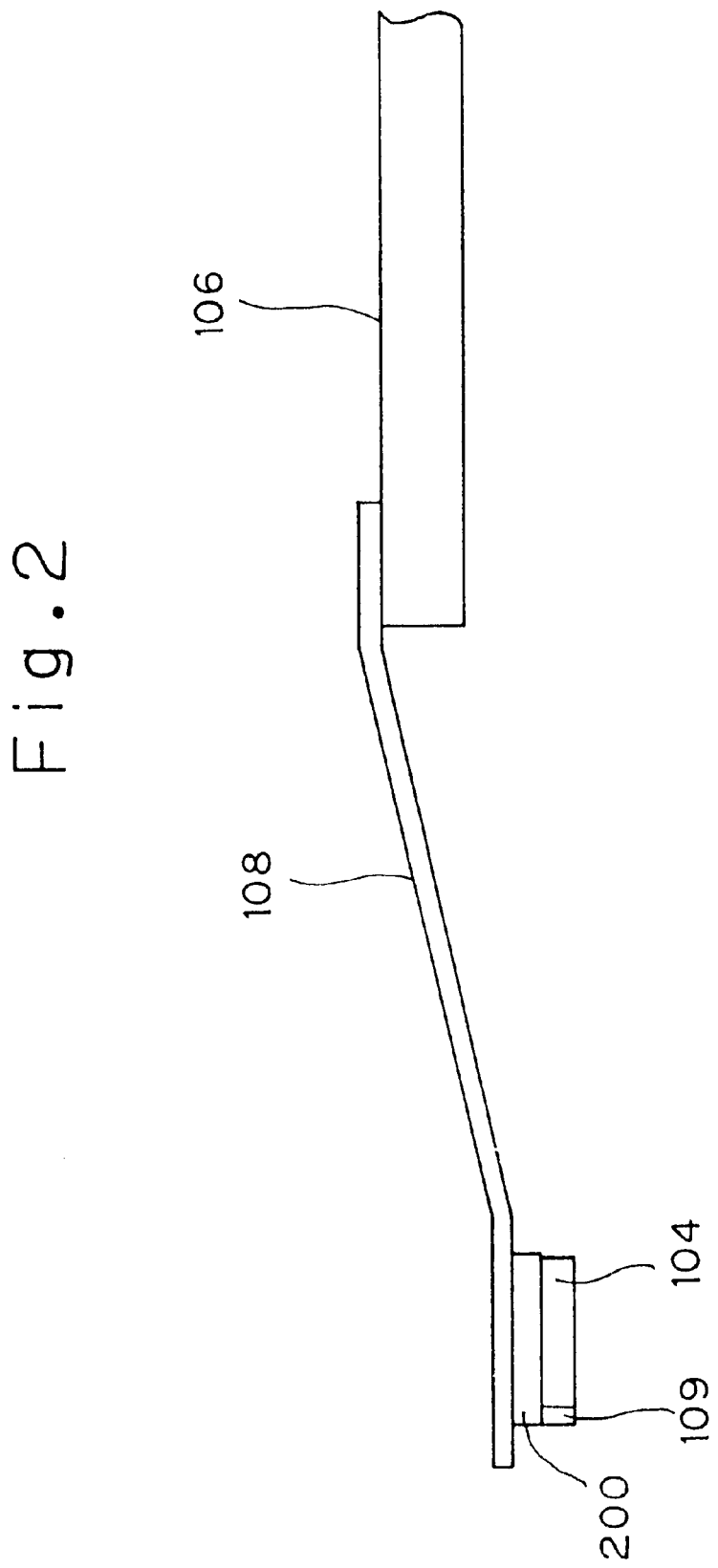
FIG. 2 is an enlarged view in the vicinity of a suspension.

FIG. 2 is an enlarged view in the vicinity of the suspension 108 shown in FIG. 1.

FIG. 2 shows the tip end portion of the carriage arm 106 shown in FIG. 1. As described above, the suspension 108 is fixed to the tip end portion of the carriage arm 106. The suspension 108 functions as a leaf spring bent in a direction in which the magnetic disk is attached or detached (vertical direction of FIG. 2). Moreover, the suspension 108 holds the slider 104 via a piezoelectric actuator 200, and a magnetic head 109 is mounted on the slider 104. The piezoelectric actuator 200 drives the slider 104 independently of the arm actuator shown in FIG. 1 to slightly move the magnetic head 109. The piezoelectric actuator 200 shows the first embodiment of the piezoelectric actuator of the present invention, and also shows one example of a head portion actuator referred to in the present invention. When the piezoelectric actuator 200 slightly moves the magnetic head 109, the magnetic head 109 is exactly positioned.

Figure 3:
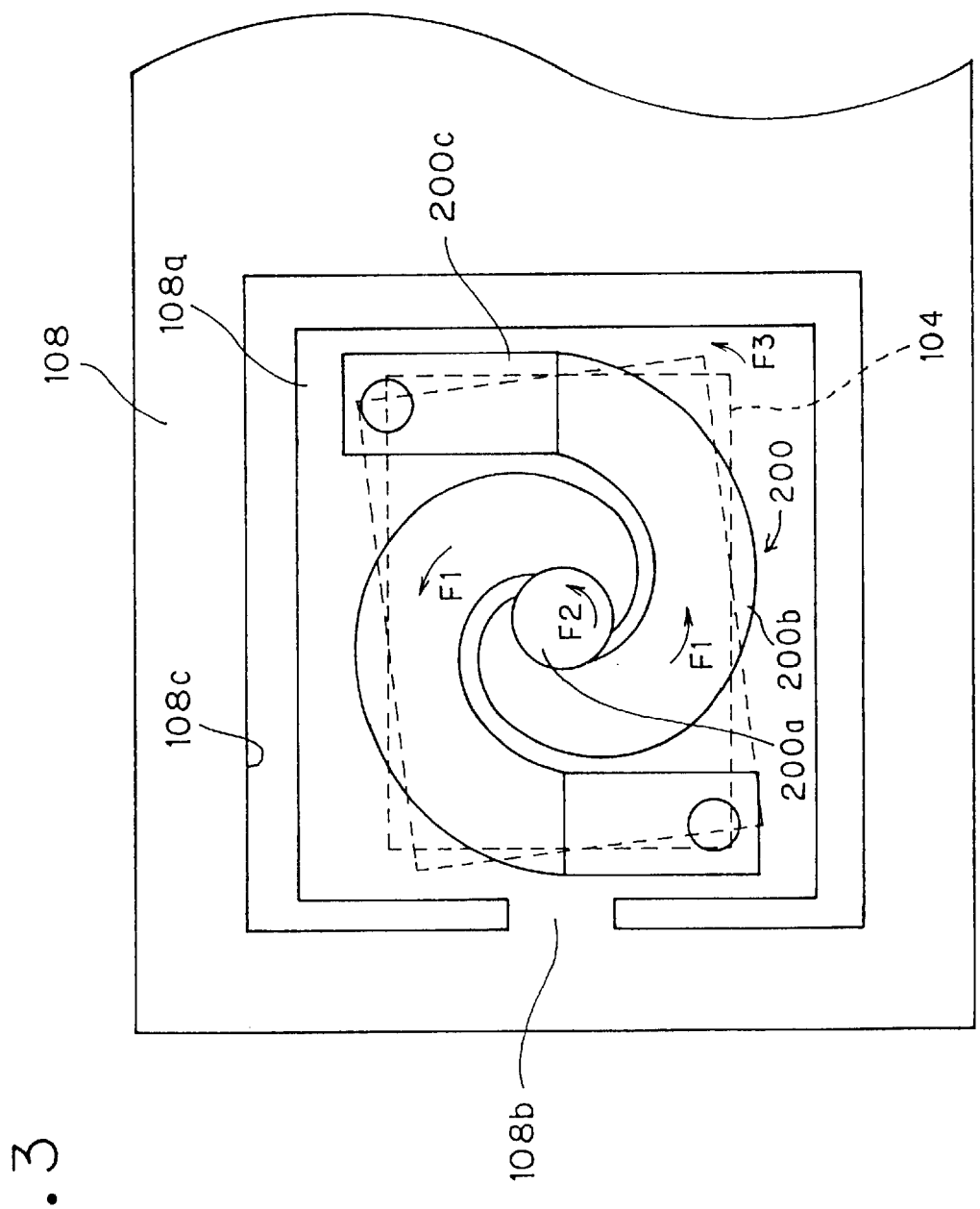
FIG. 3 is an enlarged view of a tip end portion of the suspension.

FIG. 3 is an enlarged view of the tip end portion of the suspension 108.

The piezoelectric actuator 200 is attached to an attachment portion 108a on the tip end of the suspension 108, and a periphery of the attachment portion 108a is surrounded with a groove 108c excluding an excessively narrow bridging portion 108b. This particularly enhances the function of the suspension 108 as the leaf spring in the attachment portion 108a.

The piezoelectric actuator 200 includes a center body 200a and two spiral arms 200b, a tip end 200c of the arm 200b is fixed to the attachment portion 108a, and the center body 200a is fixed to a gravity center of the slider 104. Moreover, the piezoelectric actuator 200 is provided with a lamination structure including a piezoelectric layer having a two-dimensional shape described later and an electrode layer for holding the piezoelectric layer.

Figure 4:
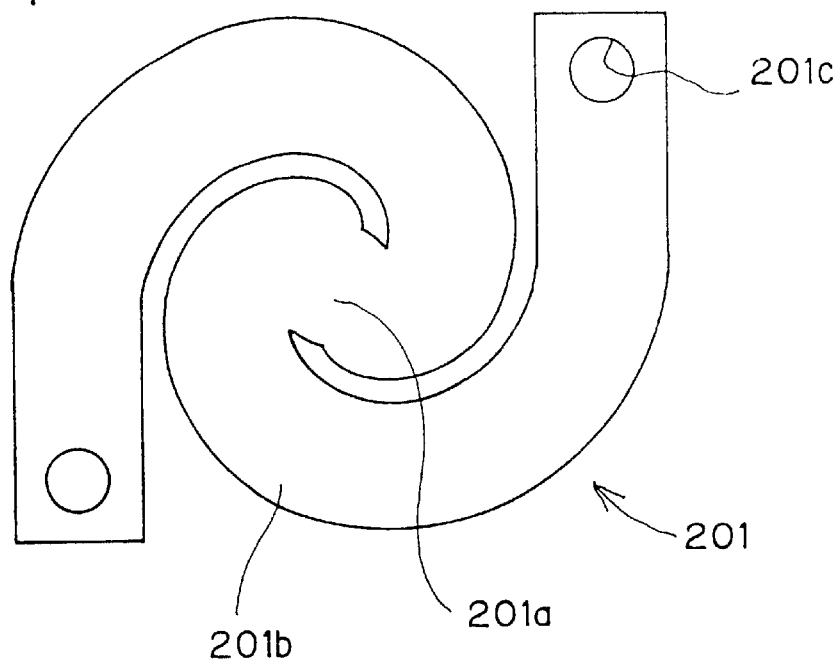
FIG. 4 is a diagram showing a shape of a piezoelectric layer.
Figure 5:
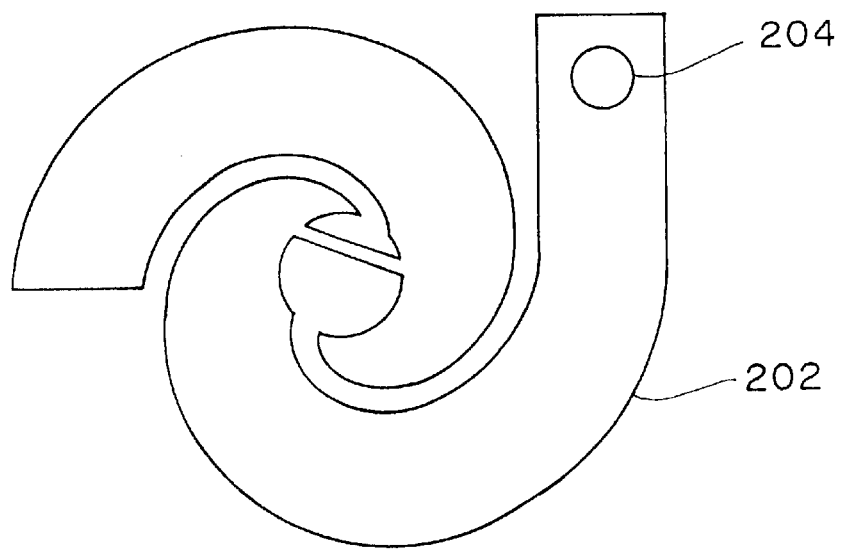
FIG. 5 is a diagram showing the shape of a power supply electrode layer.
Figure 6:
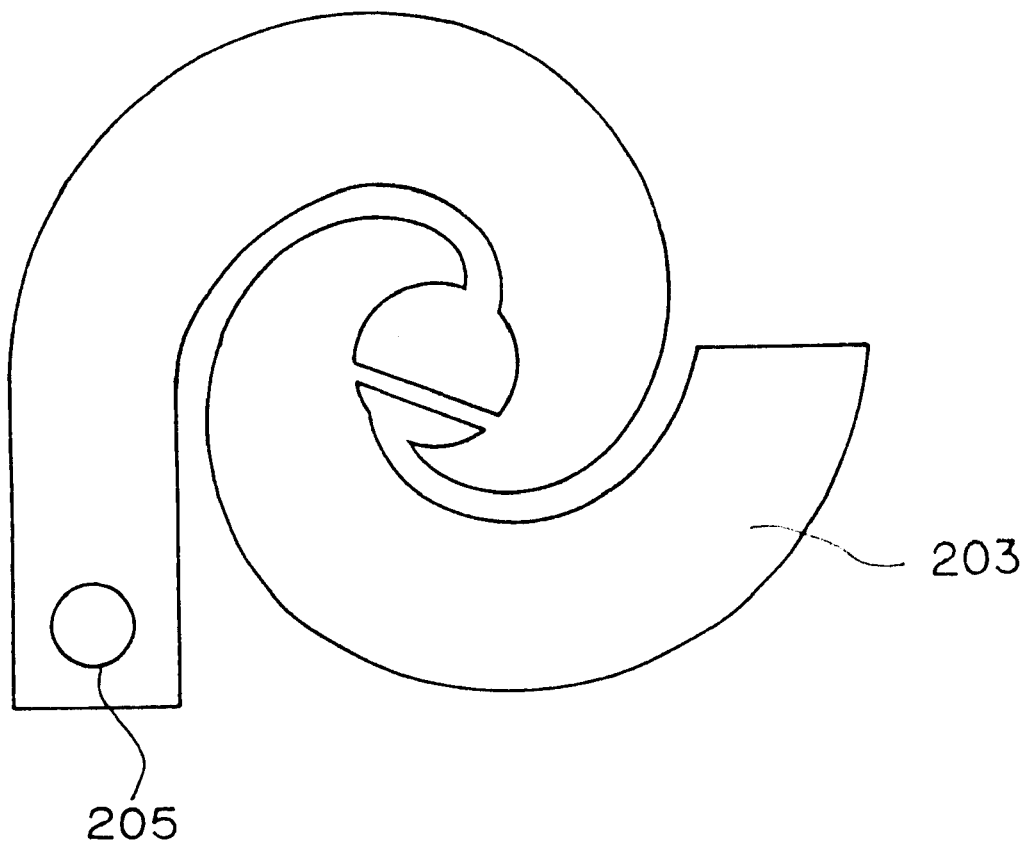
FIG. 6 is a diagram showing the shape of a ground electrode layer.

FIG. 4 is a diagram showing the shape of the piezoelectric layer, FIG. 5 is a diagram showing the shape of a power supply electrode layer, and FIG. 6 is a diagram showing the shape of a ground electrode layer.

A piezoelectric layer 201 shown in FIG. 4, a power supply electrode layer 202 shown in FIG. 5, and a ground electrode layer 203 shown in FIG. 6 are laminated in order of the power supply electrode layer 202, piezoelectric layer 201, ground electrode layer 203, piezoelectric layer 201, power supply electrode layer 202, piezoelectric layer 201, . . . to constitute the piezoelectric actuator 200 shown in FIG. 3.

The piezoelectric layer 201 shown in FIG. 4 includes a central portion 201a, and two arm portions 201b extending from the central portion 201a. These central portion 201a and arm portion 201b correspond to the center body 200a and arm 200b of the piezoelectric actuator 200 shown in FIG. 3, respectively.

Two arm portions 201b constitute one example of an arm portion group referred to in the present invention, and the arm portion group constituted by two arm portions 201b entirely indicates rotation symmetry and nonlinear symmetry. Specifically, a symmetric axis exists twice in the central portion 201a, two arm portions 201b overlap with each other by rotation movement of 180° centering on the central portion 201a, but no linear symmetry exists. Moreover, the respective arm portions 201b turn to a backside via the central portion 201a with respect to a root in which the arm portion 201b is connected to the central portion 201a. As described later, this structure causes large displacement at a low voltage.

Respective tip ends of two arm portions 201b are provided with through holes 201c through which via holes described later are passed. The present embodiment is provided with a plurality of piezoelectric layers 201, so that drive voltage is lowered and displacement amount is increased.

The power supply electrode layer 202 shown in FIG. 5, and the ground electrode layer 203 shown in FIG. 6 are electrodes whose shapes are adapted for two arm portions 201b shown in FIG. 4, and the piezoelectric layer 201 is held between the power supply electrode layer 202 and the ground electrode layer 203. When the drive voltage is applied between the power supply electrode layer 202 and the ground electrode layer 203, two arm portions 201b are contracted. When the drive voltage disappears, two arm portions 201b are extended to return to an original state.

A via 204 is connected to the power supply electrode layer 202 in a position of one of two through holes 201c, and this via 204 connects the power supply electrode layers 202 to each other. Moreover, a via 205 is connected to the ground electrode layer 203 in a position of the other through hole, and the via 205 connects the ground electrode layers 203 to each other.

Figure 7:
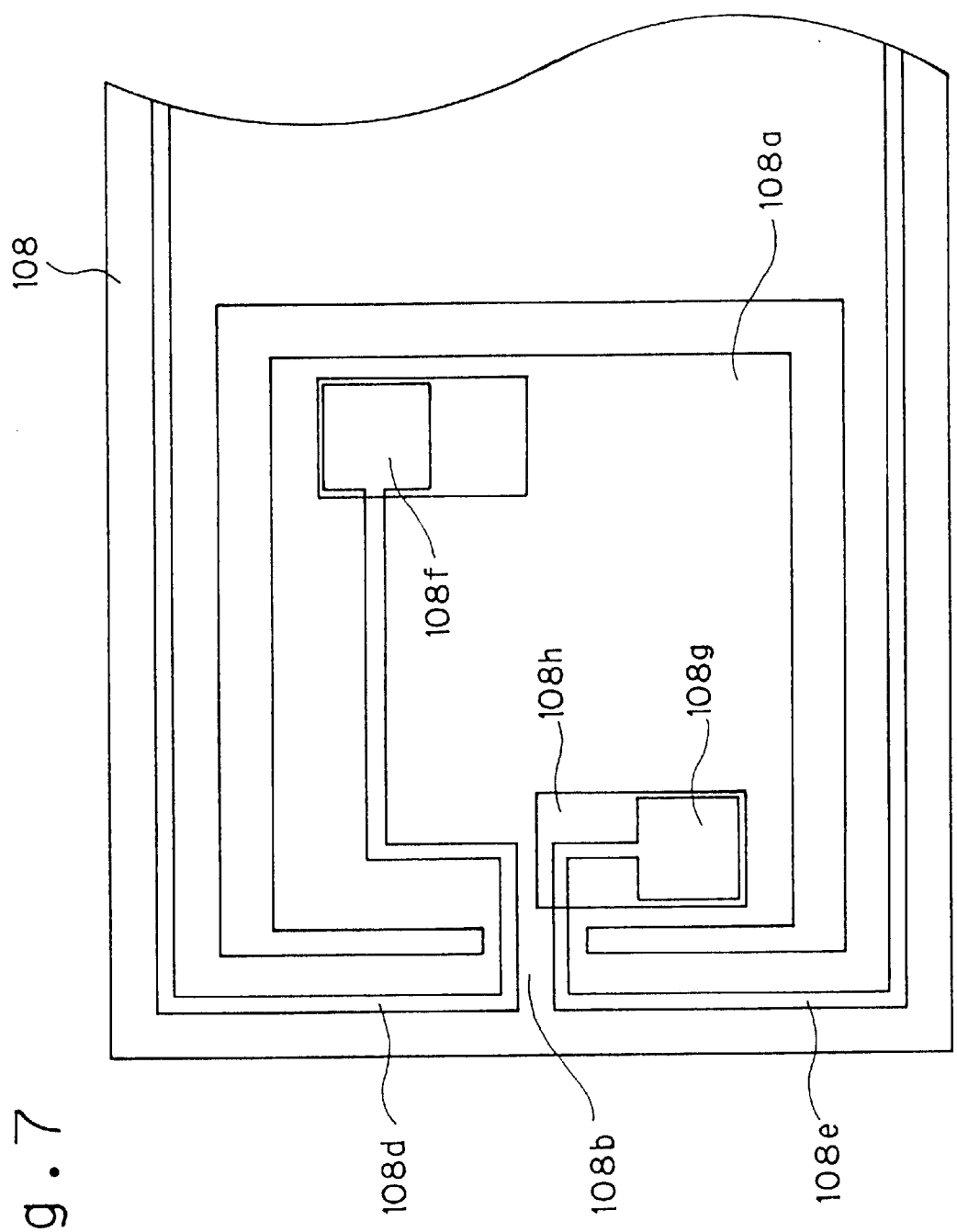
FIG. 7 is a diagram showing wiring in the suspension.

FIG. 7 is a diagram showing wiring in the suspension.

The suspension 108 is provided with a power supply wire 108d and ground wire 108e connected to the attachment portion 108a from the root of the suspension 108 via the bridging portion 108b, and the power supply wire 108d and ground wire 108e are covered with an insulating film. Moreover, respective tip ends of the power supply wire 108d and ground wire 108e are provided with a power supply terminal 108f and ground terminal 108g, and by a conductive adhesive layer 108h formed on the power supply terminal 108f and ground terminal 108g, the tip end 200c of the arm 200b of the piezoelectric actuator 200 shown in FIG. 3 is fixed to the suspension 108. The power supply terminal 108f and ground terminal 108g are connected to the power supply electrode layer 202 shown in FIG. 5 and the ground electrode layer 203 shown in FIG. 6 via the conductive adhesive layer 108h, and this saves a wiring trouble and lowers cost.

When the drive voltage is applied between the power supply wire 108d and the ground wire 108e, the drive voltage is applied between the power supply terminal 108f and the ground wire 108g, and between the power supply electrode layer 202 and the ground electrode layer 203, and the arm portion 201b of the piezoelectric layer 201 shown in FIG. 4 is contracted in an in-layer direction. As a result, the arm 200b shown in FIG. 3 is contracted.

Description will continue with reference to FIG. 3.

Since the tip end 200c of the arm 200b is fixed to the attachment portion 108a as described above, on contraction of the piezoelectric layer arm portion by the applied power supply voltage, a force of attracting the respective arms 200b of the piezoelectric actuator 200 toward the tip end 200c is generated as shown by an arrow F1 of FIG. 3. Subsequently, by the force the piezoelectric actuator 200 is deformed and the center body 200a rotates in a direction of an arrow F2, and the slider 104 rotates in a direction of an arrow F3. As a result, the magnetic head mounted on the slider 104 moves.

This action is generated even if the arm 200b fails to be smoothly spiral as shown in FIG. 3, and the shape of the arm and arm portion may be a shape constituted by joining rectangles, or another shape, as long as a plurality of arms are formed entirely in rotation symmetry and nonlinear symmetry. Therefore, a degree of freedom in the shape of the arm and arm portion is high.

Additionally, the force of attracting the respective arms 200b toward the tip end 200c as shown by the arrow F1 is a force of linearly attracting the root connecting the arm 200b to the center body 200a toward the tip end 200c, but similarly as the arm portion of the piezoelectric layer, since the arm 200b of the piezoelectric actuator 200 turns to the backside of the center body 200a, the root moves largely around the center body 200a. Therefore, even if the arm 200b is slightly contracted, the center body 200a rotates at a large rotation angle, and large displacement of a head position is therefore caused at a low drive voltage. Additionally, when the arm 200b further turns (e.g., around the center body 200a once), the rotation angle of the center body 200a further increases. Additionally, in this case, rigidity and workability of the piezoelectric actuator 200 are deteriorated.

As described above, the center body 200a of the piezoelectric actuator 200 is fixed to the gravity center of the slider 104. Moreover, the piezoelectric actuator 200 causes rotation displacement centering on the center body 200a, and the gravity center of the piezoelectric actuator 200 itself exists in the position of the center body 200a. Therefore, when the piezoelectric actuator 200 is displaced to drive the slider 104 and magnetic head, the inertia moment is small, resonance frequency of a composite material including the piezoelectric actuator 200, slider 104 and magnetic head is high, and the composite material can make a high-rate response.

Figure 8:
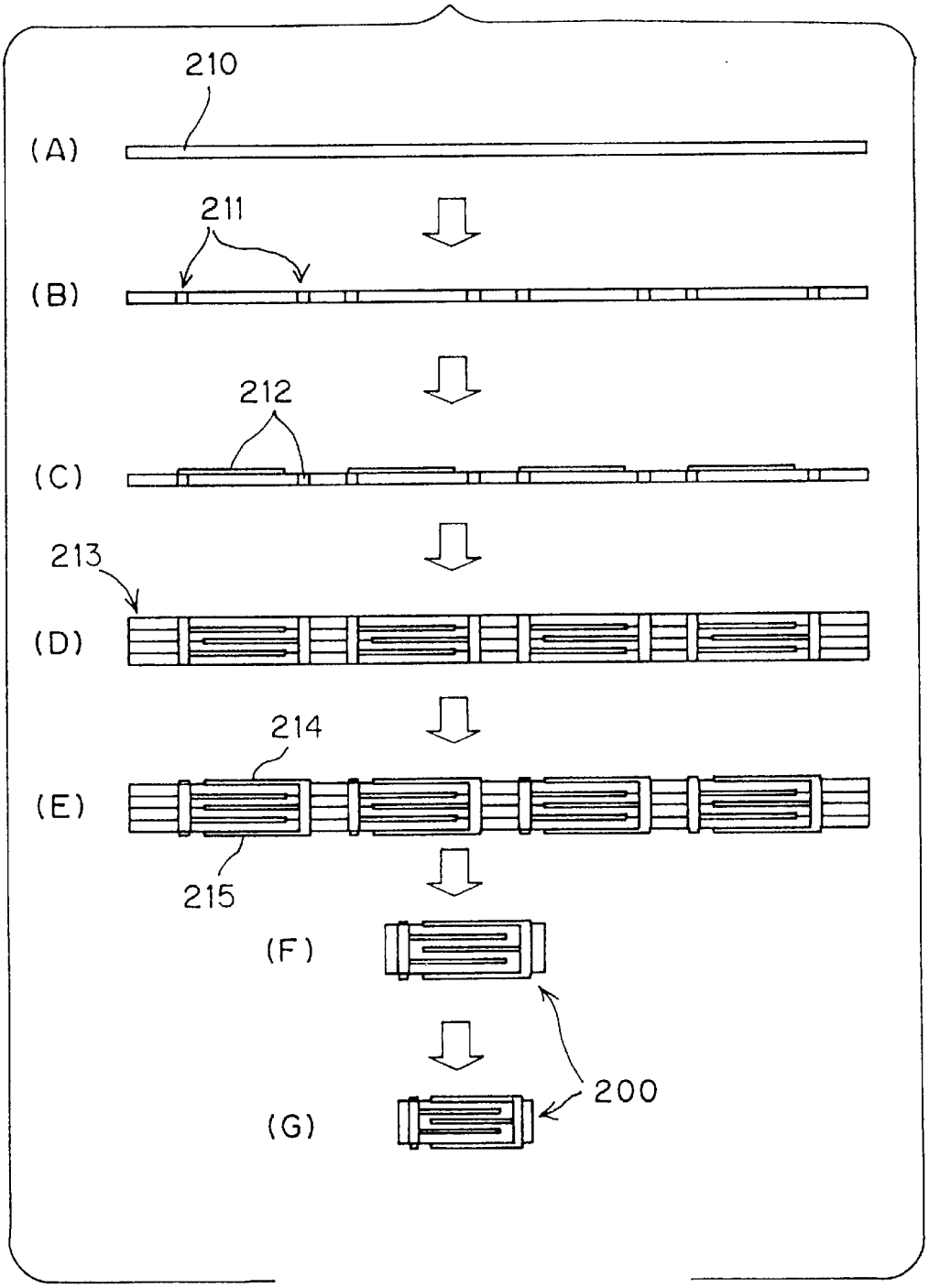
FIG. 8 is a diagram showing a manufacture process of a piezoelectric actuator.

FIG. 8 is a diagram showing a manufacture process of the piezoelectric actuator.

Here, the manufacture process is shown in which the piezoelectric actuator is manufactured by a green sheet lamination method utilized in a circuit substrate or the like.

First, a 65 $\mu$m thick green sheet 210 including PNN-PT-PZ based piezoelectric ceramic powder is molded by a doctor blade method in a range of a plurality of piezoelectric actuators (FIG. 8A).

Subsequently, via holes 211 each having a diameter of 50 µm are punched in predetermined positions of the green sheet 210 (FIG. 8B).

Thereafter, by screen printing, an Ag—Pd electrode paste 212 is embedded in the via hole 211, and the Ag—Pd electrode paste 212 is patterned/printed in an electrode layer shape shown in FIGS. 5 and 6 (FIG. 8C).

The aforementioned respective processes are repeated a plurality of times (four times herein) to form a laminate 213, and the laminate is unified by heating press (FIG. 8D).

Subsequently, the electrode paste is printed on a front surface and a back surface to form a surface electrode 214 (FIG. 8E), a spiral outer shape is formed by punching press and the respective piezoelectric actuators 200 are individualized (FIG. 8F).

Finally, degreasing and calcining are performed in the atmosphere to complete the piezoelectric actuator 200 (FIG. 8G). Processing may be performed after calcining as occasion demands.

The piezoelectric actuator manufactured through the manufacture process is a piezoelectric ceramic solid, processing and assembly are hardly necessary, and manufacture can inexpensively be performed.

Moreover, the layers are easily and inexpensively connected to one another by the via holes, and can easily be connected to the terminal on the suspension by the surface electrode 214.

Additionally, here, after forming the laminate 213, the outer shape of the piezoelectric actuator 200 is formed by punching press to individualize the actuators, but the outer shape of the piezoelectric actuator 200 may be formed during punching of the via hole. Moreover, the piezoelectric actuator 200 may be individualized by ultrasonic processing, blast processing, laser processing, water jet processing, and the like, after calcining the laminate 213 shown in FIG. 8D, performing surface polishing and forming the surface electrode.

Moreover, the piezoelectric layer is formed by the green sheet method, but may be formed by a printing multi-layer method.

Furthermore, it is advantageous in respect of cost to integrally calcine the surface electrode 214 as described above, but the laminate 213 may be calcined before forming the surface electrode 214, and the surface electrode 214 may then be formed by a printing method, gas phase method, or the like.

Here, the piezoelectric actuator 200 shown in FIG. 3 was manufactured by the manufacture process shown in FIG. 8 in the following specification.

Outer shape dimension: 1.0×1.0×0.16 mm
Weight: 0.8 mg
Drive layer (piezoelectric layer) number: 4 layers
Drive layer (piezoelectric layer) thickness: 40 µm
Piezoelectric material: PNN-PT-PZ based ceramic (piezoelectric constant d31=300 pm/V)
Electrode material: Ag—Pd When the piezoelectric actuator 200 of this specification was fixed to the suspension 108 and slider 104 as shown in FIG. 3 and operation characteristics were evaluated, movable distance of the magnetic head was 1.5 µm at a drive voltage of 12 V, positioning precision of the magnetic head was 0.03 µm, and mechanical resonance frequency was 12 kHz.

On the other hand, when no piezoelectric actuator was used and operation characteristics only by the electromagnetic actuator were evaluated for comparison with the present embodiment, the positioning precision was 0.12 µm, and the mechanical resonance frequency was 600 Hz.

Specifically, for the hard disk drive using the piezoelectric actuator of the first embodiment, the magnetic head can be moved at a high positioning precision and high rate, recording density can be increased, and read/write rate can be increased.

The first embodiment of the information storage apparatus and piezoelectric actuator has been described above, and a second embodiment of the information storage apparatus and piezoelectric actuator will be described hereinafter. Additionally, different respects of the second embodiment from the first embodiment will mainly be described, and redundant description is omitted.

Figure 9:
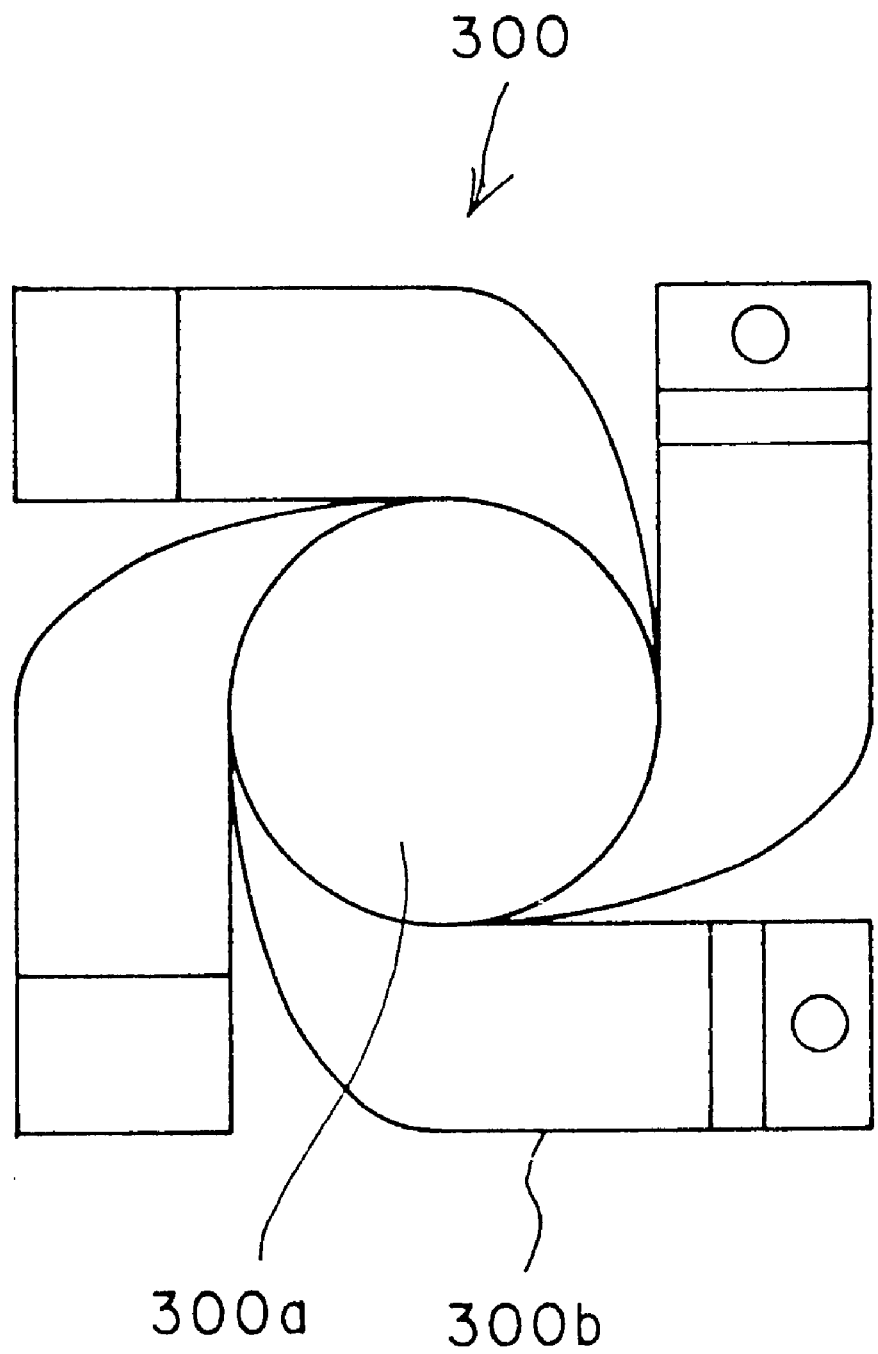
FIG. 9 is a diagram showing a second embodiment of the piezoelectric actuator of the present invention.

FIG. 9 is a diagram showing the second embodiment of the piezoelectric actuator of the present invention.

A piezoelectric actuator 300 of the second embodiment is similar to the piezoelectric actuator 200 of the first embodiment, except that the actuator is provided with a center body 300a and four arms 300b, and the piezoelectric actuator 300 of the second embodiment is also constituted of the piezoelectric layer, power supply electrode layer, and ground electrode layer. Moreover, the piezoelectric layer is also provided with the central portion corresponding to a center body 300a, and four arm portions corresponding to four arms 300b. When the drive voltage is applied between the power supply electrode layer and the ground electrode layer, according to a principle similar to that of the piezoelectric actuator 200 of the first embodiment, the center body 300a rotates.

Figure 10:
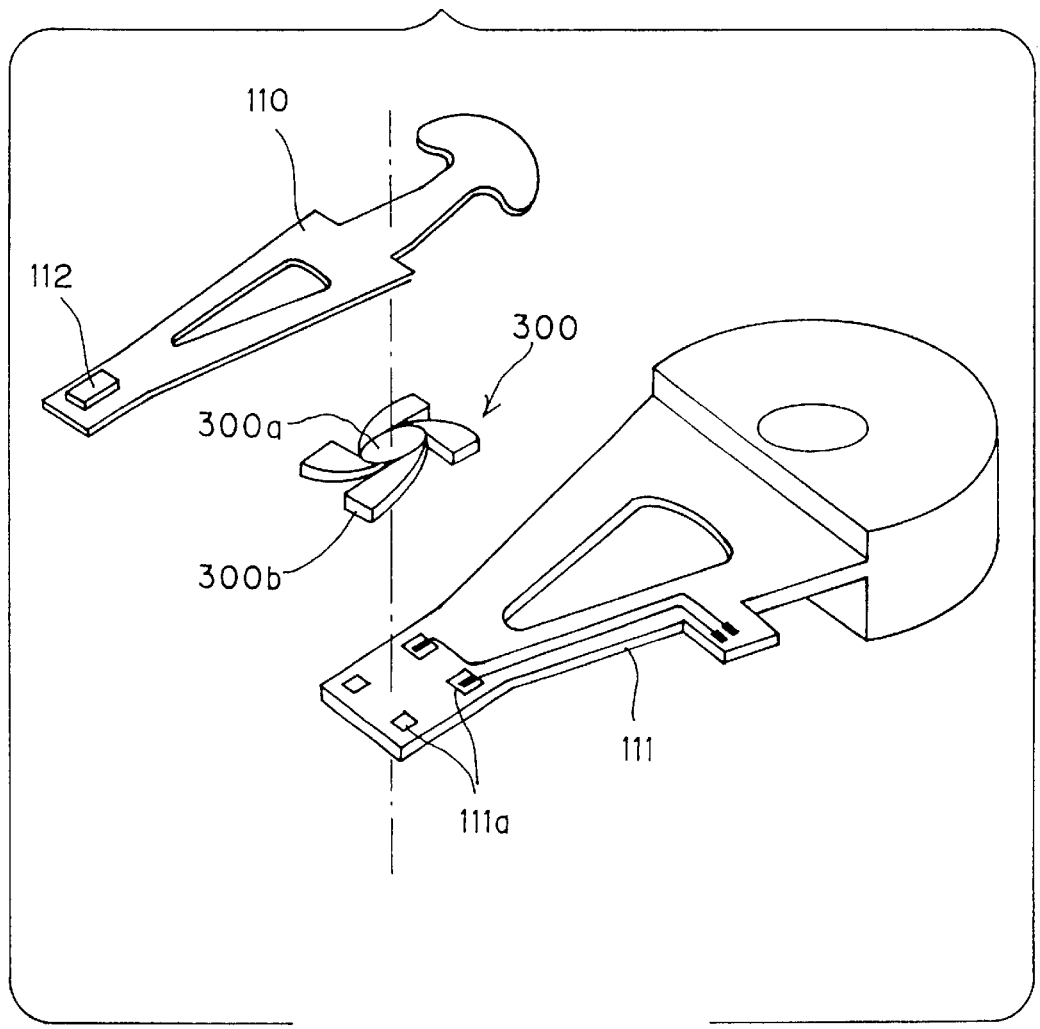
FIG. 10 is an exploded perspective view in the vicinity of the suspension in the second embodiment of the information storage apparatus of the present invention.

FIG. 10 is an exploded perspective view in the vicinity of the suspension in the second embodiment of the information storage apparatus of the present invention.

The second embodiment of the information storage apparatus is similar to the first embodiment of the information storage apparatus except that the piezoelectric actuator 300 is disposed between a suspension 110 and a carriage arm 111.

The center body 300a of the piezoelectric actuator 300 is fixed to the gravity center of the head portion including a slider 112 with the magnetic head (not shown) mounted thereon and the suspension 110, and tip ends of the respective arms 300b of the piezoelectric actuator 300 are fixed to respective fixing places 111a on the carriage arm 111. Since displacement enlarging effect is exerted by a length of the suspension 110, the displacement amount of the piezoelectric actuator 300 may be smaller than that of the piezoelectric actuator 200 shown in FIG. 2.

The piezoelectric actuator 300 of the second embodiment was manufactured by the manufacture process shown in FIG. 8 in the following specification.

Outer shape dimension: 4.0×4.0×0.16 mm
Weight: 15 mg
Drive layer (piezoelectric layer) number: 4 layers
Drive layer (piezoelectric layer) thickness: 40 µm
Piezoelectric material: PNN-PT-PZ based ceramic (piezoelectric constant d31=300 pm/V)
Electrode material: Ag—Pd When the piezoelectric actuator 300 of this specification was fixed to the carriage arm 111 and suspension 110 as shown in FIG. 10 and the operation characteristics were evaluated, the movable distance of the magnetic head was 1.0 µm at a drive voltage of 12 V, the positioning precision of the magnetic head was 0.07 µm, and the mechanical resonance frequency was 8 kHz. Therefore, even for the hard disk in which the piezoelectric actuator of the second embodiment is incorporated, the magnetic head can be moved with high positioning precision and at high rate, the recording density can be raised, and high-rate read/write can be realized.

Additionally, in the aforementioned first and second embodiments, the center body of the piezoelectric actuator is fixed to a magnetic head side, the tip end of the piezoelectric actuator arm is fixed to an arm side, then the inertia moment can advantageously be reduced. However, in the mode of fixing the head actuator as referred to in the present invention, this mode is not limited, and for example, the center body of the piezoelectric actuator may be fixed to the arm side, while the tip end of the piezoelectric actuator arm may be fixed to the magnetic head side.

Moreover, in the first and second embodiments, the arm portion of the piezoelectric layer is disposed in symmetry twice and four times, but the arm portion referred to in the present invention may be disposed in symmetry three times or five times.

Furthermore, in the first and second embodiments, the number of piezoelectric layers is four, but the piezoelectric layer referred to in the present invention may be of single layer or multiple layers. As the number of layers increases, low voltage, high displacement, and high rigidity are advantageously realized but the cost is increased.

Additionally, a conduction mode of the piezoelectric actuator electrode with the wiring on the suspension and arm is not limited to the joining by the conductive adhesive, and conduction may be obtained by soldering or by simple contact.

Moreover, as an inner layer electrode of the piezoelectric actuator, an Ag—Pd electrode, Pt electrode, and the like are suitable, because integral calcining with PZT based piezoelectric ceramic is possible, but an Ag electrode, Ni electrode or the like can be utilized depending upon the piezoelectric material. On the other hand, the electrode of the material using the same base as that of the inner layer electrode is suitably used as the surface electrode. However, when the surface electrode is formed after calcining, vapor deposition and other various electrode forming methods can be utilized, and a broad range of materials can be utilized. The connection of the electrode layers is not limited to the connection by the via hole, and connection along the side surface of the piezoelectric actuator may also be utilized.

Third, fourth and fifth embodiments of the piezoelectric actuator of the present invention will next be described. The piezoelectric actuators of the third, fourth and fifth embodiments are incorporated into the information storage apparatus instead of the piezoelectric actuator incorporated into the information storage apparatus of the first embodiment. The information storage apparatuses provided with the piezoelectric actuators of the third, fourth and fifth embodiments correspond to third, fourth and fifth embodiments of the information storage apparatus of the present invention. Only the third, fourth and fifth embodiments of the piezoelectric actuator will be described hereinafter.

Figure 11:
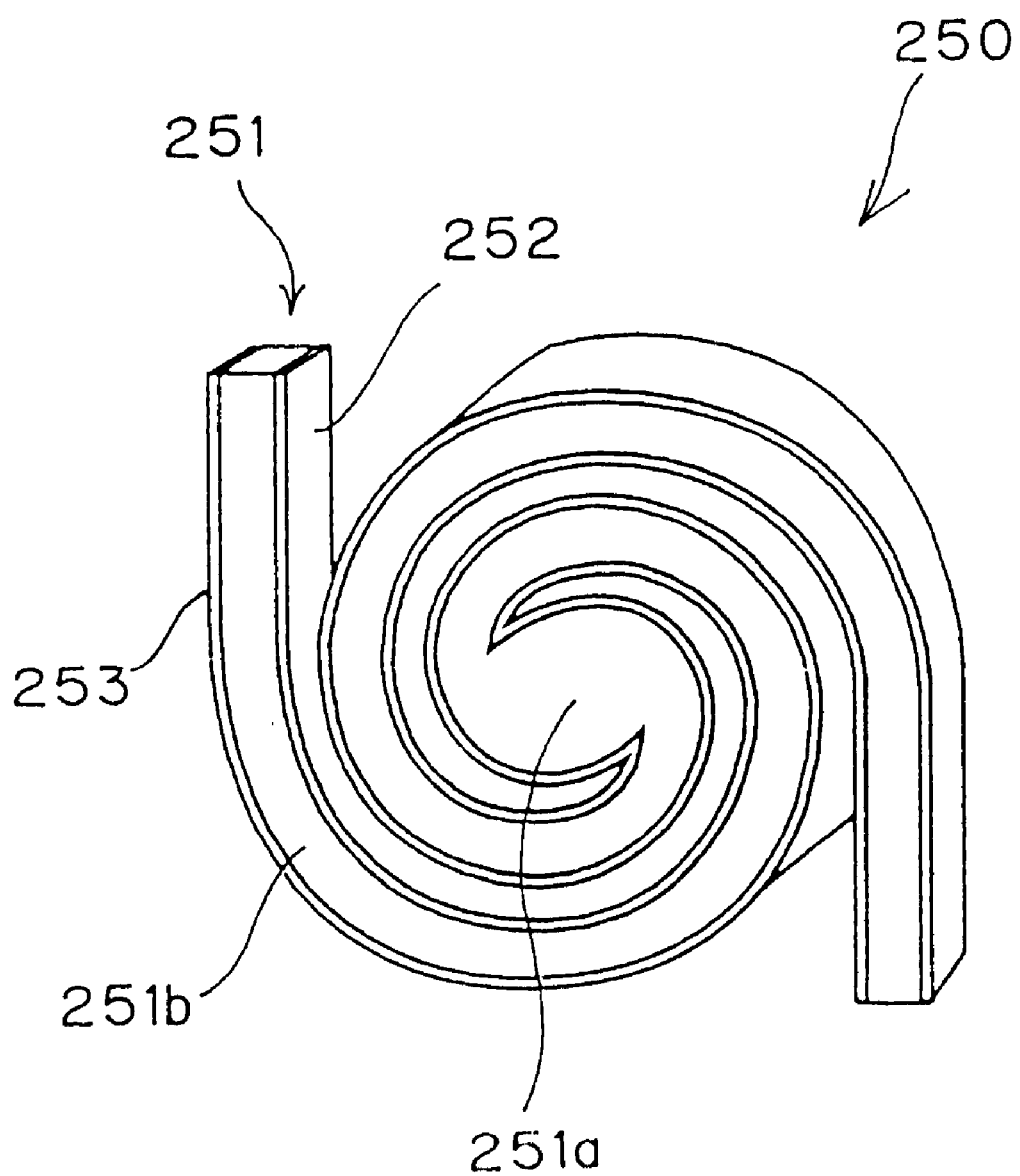
FIG. 11 is a diagram showing a third embodiment of the piezoelectric actuator of the present invention.

FIG. 11 is a diagram showing the third embodiment of the piezoelectric actuator of the present invention.

A piezoelectric actuator 250 of the third embodiment shown in FIG. 11 is provided with a piezoelectric layer 251 including a central portion 251a and two arm portions 251b, and a power supply electrode layer 252 and ground electrode layer 253 between which a piezoelectric layer 251 is held. For the piezoelectric actuator 250, the piezoelectric layer 251 is curved in a two-dimensional shape referred to in the present invention. Therefore, the lamination direction of the piezoelectric layer 251, power supply electrode layer 252, and ground electrode layer 253 is different from the lamination direction in the piezoelectric actuator of the first embodiment. However, when the power supply voltage is applied between the power supply electrode layer 252 and the ground electrode layer 253, similarly as the piezoelectric actuator of the first embodiment, the piezoelectric layer 251 is contracted in the in-layer direction and the central portion 251a rotates.

Figure 12:
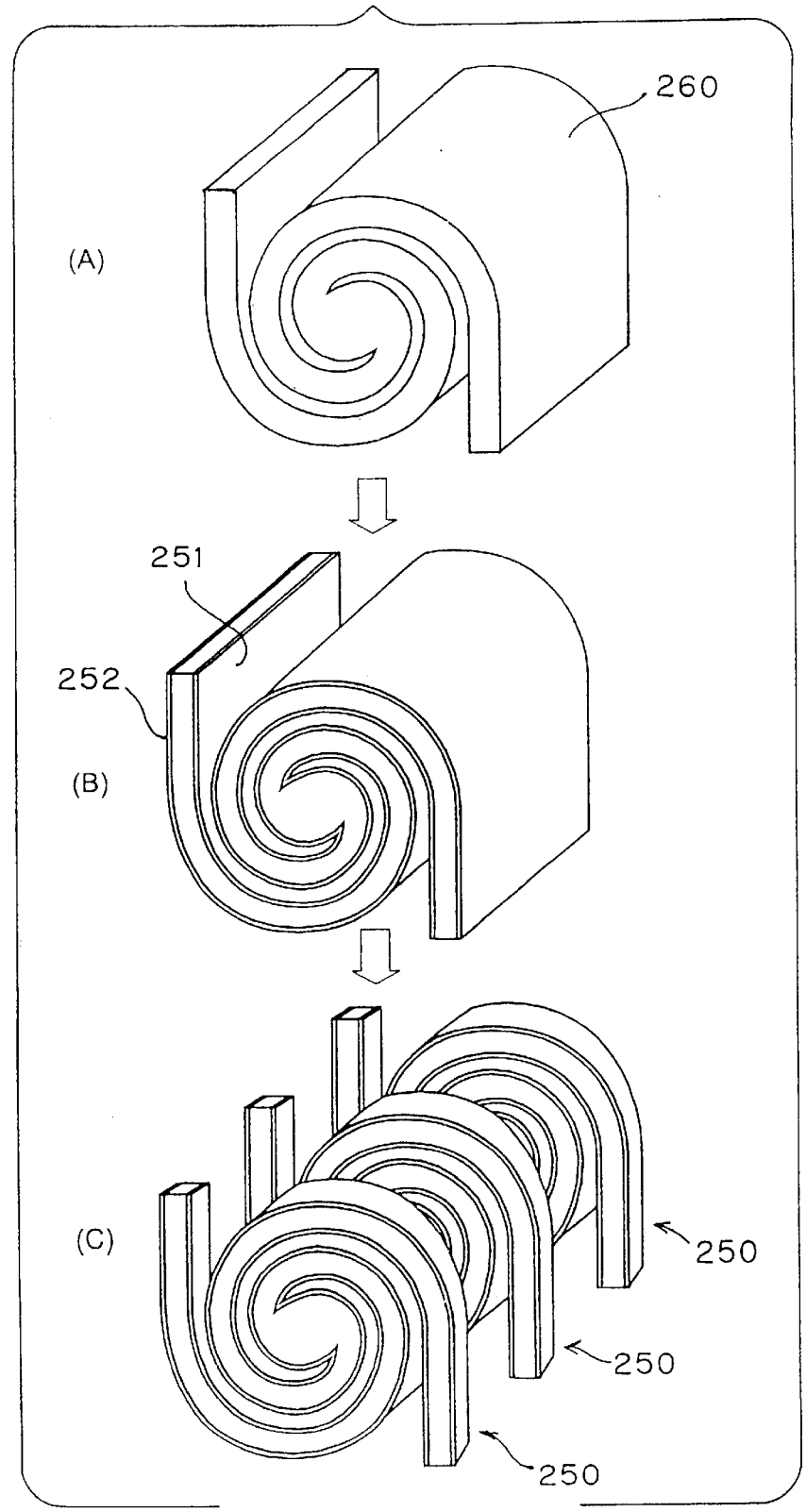
FIG. 12 is a diagram showing the manufacture process of the piezoelectric actuator of the third embodiment.

FIG. 12 is a diagram showing the manufacture process of the piezoelectric actuator of the third embodiment.

In the manufacture process, the piezoelectric material is first extruded by a mouthpiece provided with an opening of the same shape as the two-dimensional shape shown in FIG. 11, and a longitudinal material 260 is formed whose sectional shape is a two-dimensional shape shown in FIG. 11 (FIG. 12A).

Subsequently, the power supply electrode layer 252 and ground electrode layer 253 are formed on the peripheral surface of the longitudinal material 260 (FIG. 12B). Finally, by slicing the longitudinal material 260, the piezoelectric actuator 250 is obtained.

By the manufacture process, a large number of the piezoelectric actuators 250 are inexpensively manufactured.

Figure 13:
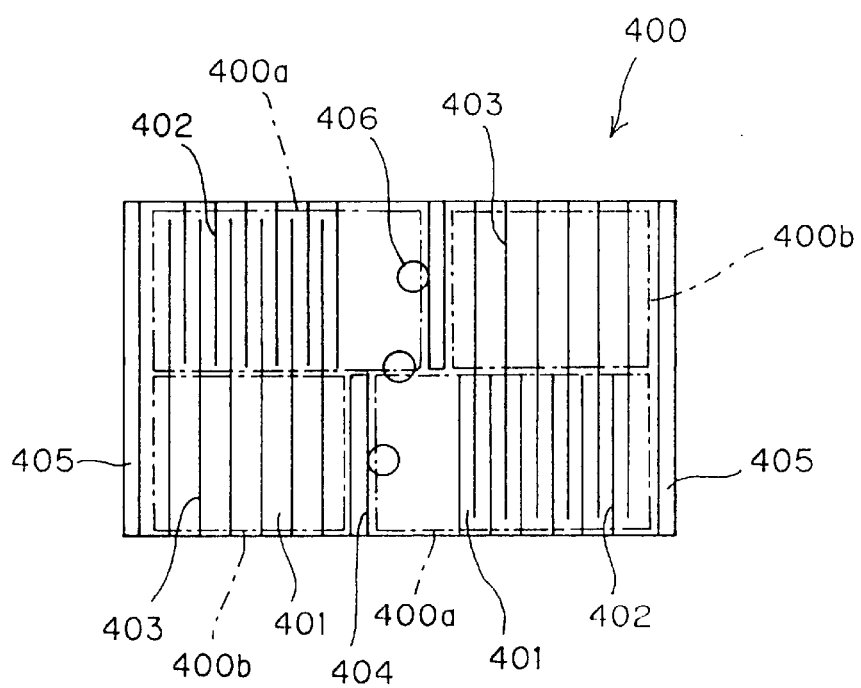
FIG. 13 is a diagram showing a fourth embodiment of the piezoelectric actuator of the present invention.
Figure 14:
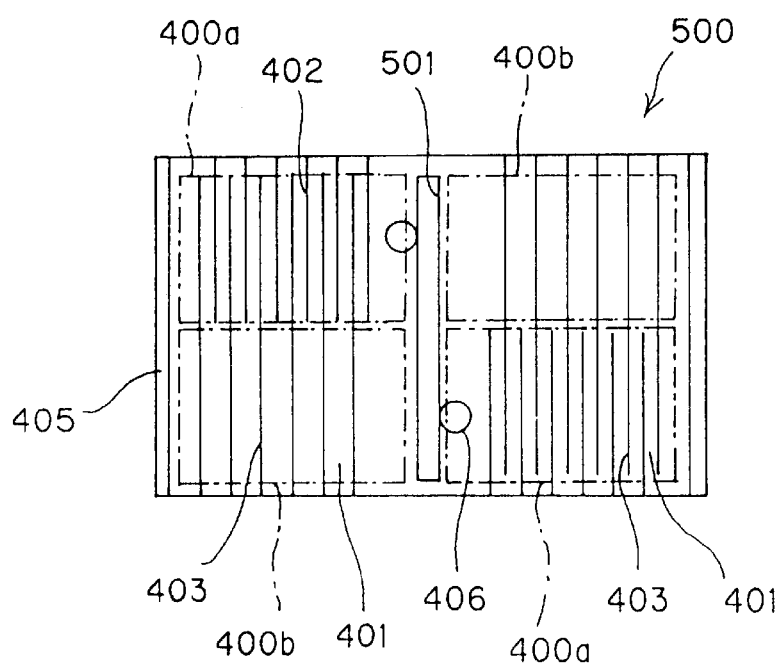
FIG. 14 is a diagram showing a fifth embodiment of the piezoelectric actuator of the present invention.

FIG. 13 is a diagram showing a fourth embodiment of the piezoelectric actuator of the present invention, and FIG. 14 is a diagram showing a fifth embodiment of the piezoelectric actuator of the present invention.

A piezoelectric actuator 400 shown in FIG. 13 is provided with a lamination structure including a piezoelectric layer 401 of the piezoelectric material, a power supply electrode layer 402, and a ground electrode layer 403. The power supply electrode layers 402 or the ground electrode layers 403 are connected to one another by external electrodes disposed along the side surface of the piezoelectric actuator 400.

Moreover, the piezoelectric actuator 400 is provided with a driving portion 400a of a layer structure in which the piezoelectric layer 401 is held between the power supply electrode layer 402 and the ground electrode layer 403, and an immobile portion 400b in which the piezoelectric layer 401 is held between the ground electrode layers 403. The driving portion 400a is extended in the lamination direction (horizontal direction of FIG. 13) when the drive voltage is applied between the power supply electrode layer 402 and the ground electrode layer 403, and is compressed and returned when the applied voltage disappears. Furthermore, other portions of the piezoelectric actuator 400 excluding the driving portion 400a and immobile portion 400b function as a holding portion for holding the driving portion 400a and immobile portion 400b, and this holding portion holds a integral structure of the piezoelectric actuator by holding two driving portions 400a entirely in the arrangement of rotation symmetry and nonlinear symmetry.

The piezoelectric actuator 400 is joined to the suspension by two end joint materials 405, and joined to the slider by three middle joint materials 406. Moreover, when the driving portion 400a is extended, three middle joint materials 406 rotate centering on the middle of the piezoelectric actuator 400. Since the driving portion 400a is provided with a multilayered structure including a plurality of piezoelectric layers, large displacement occurs at the low voltage.

Moreover, in the piezoelectric actuator 400, the driving portion 400a is disposed opposite to the immobile portion 400b via a slit 404 in the lamination direction of the lamination structure. Since the slit 404 is disposed, a force generated by the extension of the driving portion 400a escapes and sufficiently large rotation displacement occurs. The slit 404 extends to the inside from the side surface of the piezoelectric actuator 400, and the integral structure of the piezoelectric actuator 400 is held in the middle portion of the piezoelectric actuator 400.

A piezoelectric actuator 500 shown in FIG. 14 is an actuator equivalent to the piezoelectric actuator 400 shown in FIG. 13 except that the structure of a slit 501 is different from the structure of the slit 404 shown in FIG. 13. Among elements constituting the piezoelectric actuator 500 shown in FIG. 14, the constituting elements equivalent to the constituting elements of the piezoelectric actuator 400 shown in FIG. 13 are denoted with the same reference numerals as those shown in FIG. 13 and description thereof is omitted.

The slit 501 of the piezoelectric actuator 500 shown in FIG. 14 exists in the middle portion of the piezoelectric actuator 500, and the integral structure of the piezoelectric actuator 500 is kept in the side surface portion of the piezoelectric actuator 500. Since the integral structure is kept in two places of the side surface portion, the piezoelectric actuator 500 shown in FIG. 14 is higher in rigidity as compared with the piezoelectric actuator 400 shown in FIG. 13.

Figure 15:
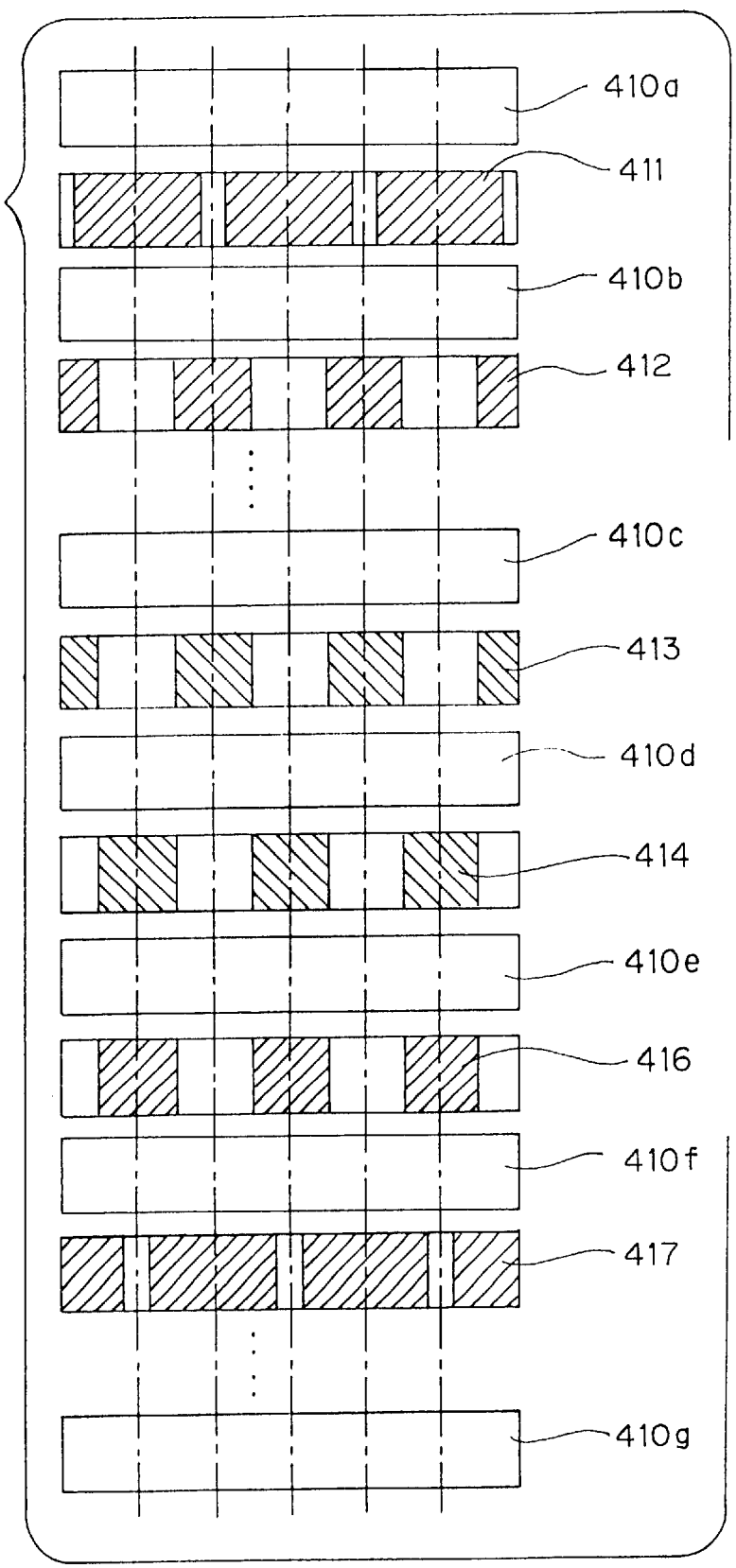
FIG. 15 is a diagram showing a process of forming a piezoelectric actuator lamination structure of the fourth embodiment.
Figure 16:
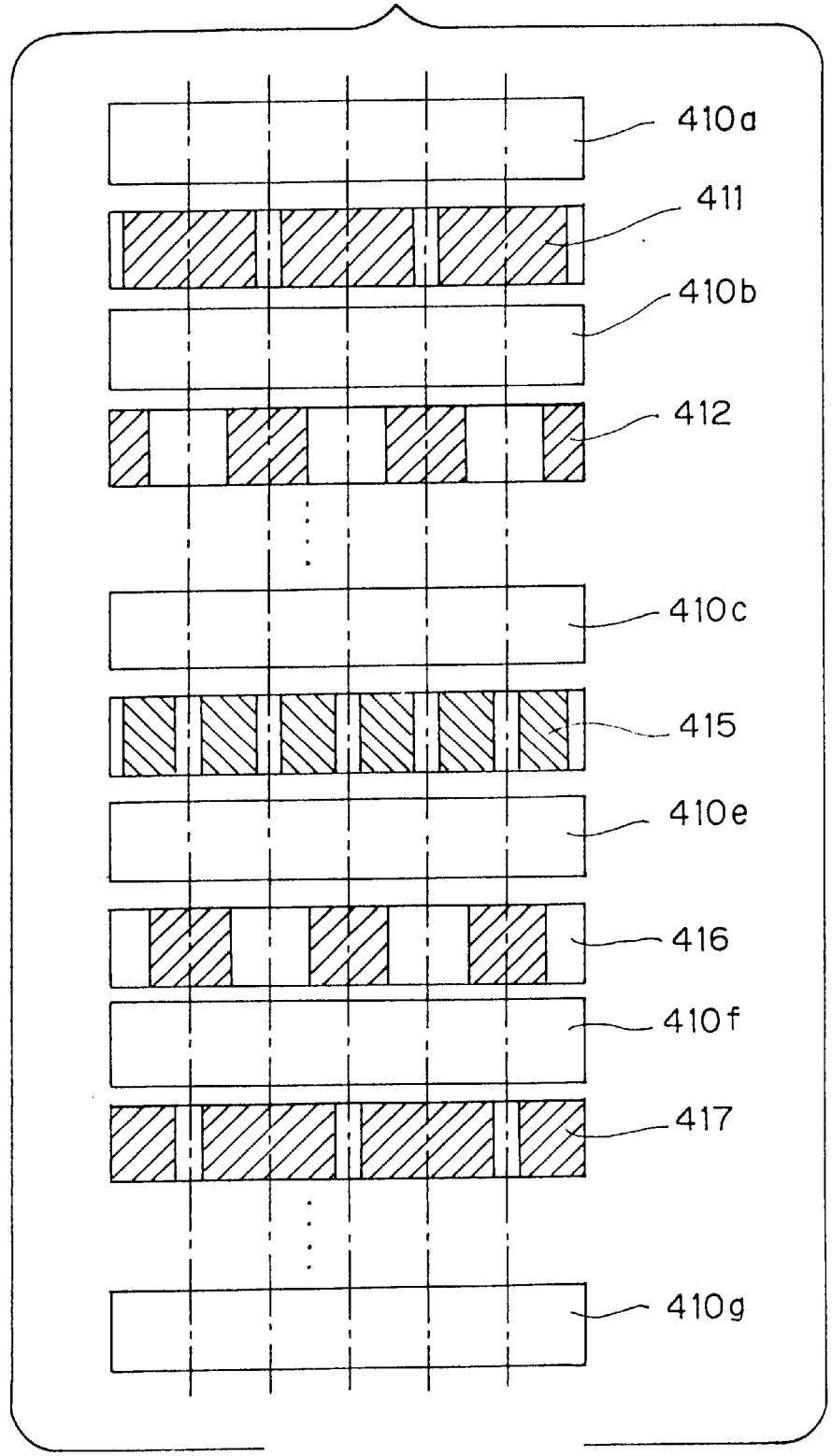
FIG. 16 is a diagram showing the process of forming the piezoelectric actuator lamination structure of the fifth embodiment.

FIG. 15 is a diagram showing a process of forming the piezoelectric actuator lamination structure of the fourth embodiment, and FIG. 16 is a diagram showing the process of forming the piezoelectric actuator lamination structure of the fifth embodiment.

FIG. 15 or 16 shows a process of once forming six lamination structures of the piezoelectric actuator 400 shown in FIG. 13 or the piezoelectric actuator 500 shown in FIG. 14, and each row divided by a dashed line of FIG. 15 or 16 corresponds to one lamination structure.

Both in the forming processes shown in FIGS. 15 and 16, a green sheet 410a using PNN-PT-PZ based ceramic powder is first formed, and a Pt paste 411 of a first pattern corresponding to the ground electrode layer 403 shown in FIGS. 13 and 14 is printed on the green sheet 410a. The first pattern Pt paste 411 covers two lamination structures.

Subsequently, a green sheet 410b is formed on the first pattern Pt paste 411, and a Pt paste 412 of a second pattern corresponding to the power supply electrode layer 402 shown in FIGS. 13 and 14 is printed on the green sheet 410b. The second pattern Pt paste 411 also covers two lamination structures, but a covering position is different from that of the first pattern Pt paste 411.

Thereafter, the formation of the green sheets 410a, 410b, and printing of the first and second pattern Pt pastes 411, 412 are repeated a necessary number of times, and subsequently, a green sheet 410c for covering the printed Pt paste is formed.

Subsequently, in the forming process shown in FIG. 15, a paste 413 mainly composed of a PVB binder is printed which has a third pattern corresponding to the slit 404 shown in FIG. 13. This third pattern is the same as the second pattern corresponding to the power supply electrode layer 402, and the paste 413 mainly composed of the PVB binder disappears during subsequent degreasing and calcining. After the third pattern paste 413 is printed, a green sheet 410d for covering the third pattern paste 413 is formed. In the forming process shown in FIG. 15, the green sheet 410d is in the middle of the lamination structure, and after the green sheet 410d, the aforementioned processes are repeated in a reverse order. Therefore, a PVB binder paste 414 having a fourth pattern alternate with the third pattern is printed on the green sheet 410d to cover the third pattern paste 413.

On the other hand, in the forming process shown in FIG. 16, after the green sheet 410c is formed, instead of the third pattern paste 413, green sheet 410d, and fourth pattern paste 414, a PVB binder paste 415 having a fifth pattern corresponding to the slit 501 shown in FIG. 14 is printed.

Thereafter, both in the forming processes shown in FIGS. 15 and 16, a green sheet 410e is formed, and subsequently, printing of a Pt paste 416 of a sixth pattern alternate with the second pattern and forming of a green sheet 410f, and printing of a Pt paste 417 of a seventh pattern corresponding to the ground electrode layer and forming of a green sheet 410g are repeated a necessary number of times.

By forming the laminate in this manner, degreasing the laminate in the atmosphere, and subsequently calcining the material, a calcined material provided with a desired lamination structure is obtained.

FIG. 17 is a diagram showing a process of processing the calcined material into the piezoelectric actuator.

FIG. 17A shows a calcined material 420 obtained by the forming process shown in FIGS. 15 and 16, and the lamination direction of the lamination structure of the calcined material 420 is a direction shown by an arrow F4. The calcined material 420 is cut into strip shapes in positions corresponding to the dashed lines shown in FIGS. 15 and 16 with a dicing saw or the like as shown by dotted lines. Thereby, a square rod 421 is obtained as one lamination structure (FIG. 17B). In a cut surface 421a of the square rod 421, respective sections of the power supply electrode layer and ground electrode layer are exposed in a state in which the power supply electrode layer and the ground electrode layer are separated from each other. By forming an external electrode 422 by vapor deposition or the like as shown in FIG. 17C, equipotential electrodes are connected to each other.

Thereafter, the square 421 is individualized/cut with the dicing saw or the like as shown by dotted lines in FIG. 17D. Thereby, the piezoelectric actuator 400, 500 is completed (FIG. 17E).

As described above, the piezoelectric actuators of the fourth and fifth embodiments can easily and inexpensively be manufactured by the processes shown in FIGS. 15 to 17.

Additionally, in the processes shown in FIGS. 15 to 17, the PVB binder paste is used to form the slit, but another-binder paste which disappears during degreasing or calcining may be used. Alternatively, after the calcined material is obtained, the slit may be formed by the dicing saw or the like.

Here, by the processes shown in FIGS. 15 to 17, the piezoelectric actuators of the fourth and fifth embodiments were formed with a driving portion thickness of 20 $\mu$m and 20 driving layers (piezoelectric layers). Subsequently, when a drive voltage of 30 V was applied between the power supply electrode layer and the ground electrode layer of the formed piezoelectric actuator, and the displacement amount in the vicinity of the slit was measured, a large displacement amount of 250 nm or more was indicated in either embodiment. Therefore, when the piezoelectric actuator is employed instead of the piezoelectric actuator of the first embodiment, it is possible to position the magnetic head at a high precision of several hundreds of nanometers.

Additionally, in the piezoelectric actuator of the present invention, the number of driving layers (piezoelectric layers) is not limited to 20, and any number of layers may of course be formed.

As described above, according to the present invention, the low-cost, high-performance piezoelectric actuator can be obtained. Moreover, when the piezoelectric actuator is incorporated, information read/write precision in the information storage apparatus can largely be enhanced, and the small-sized lightweight information storage apparatus with a high recording density can be obtained.

What is claimed is:

1. A piezoelectric actuator comprising:
   a piezoelectric layer which is formed of a piezoelectric material of a two-dimensional shape provided with a central portion, and a group of arm portions extended to the outside from the central portion in rotation symmetry and nonlinear symmetry, and which is compressed/extended in an in-layer direction; and
   a plurality of electrode layers for holding said piezoelectric layer.

2. An information storage apparatus comprising:
   a head portion on which a head for performing at least one of information recording and information reproduction with respect to a predetermined information storage medium is mounted;
   an arm portion for holding the head portion in such a manner that the head mounted on said head portion is disposed in the vicinity of or in contact with said information storage medium;
   an arm portion actuator for driving said arm portion to move the head mounted on the head portion held by the arm portion along said information storage medium; and
   a head portion actuator for rotating said head portion with respect to said arm portion and centering on a gravity center of the head portion,
   wherein said head portion actuator comprises:
      a piezoelectric layer which is formed of a piezoelectric material of a two-dimensional shape provided with a central portion, and a group of arm portions extended to the outside from the central portion in rotation symmetry and nonlinear symmetry, and which is compressed/extended in an in-layer direction; and
      a plurality of electrode layers for holding said piezoelectric layer.

* * * * *